United States Patent [19]

Baum et al.

[11] Patent Number: 4,574,095

[45] Date of Patent: Mar. 4, 1986

[54] SELECTIVE DEPOSITION OF COPPER

[75] Inventors: Thomas H. Baum, San Jose; Frances A. Houle, Fremont; Carol R. Jones, San Jose, all of Calif.; Caroline A. Kovac, Ridgefield, Conn.

[73] Assignee: International Business Machines Corporation, Armonk, N.Y.

[21] Appl. No.: 672,975

[22] Filed: Nov. 19, 1984

[51] Int. Cl.$^4$ .......................... B05D 3/06; B05D 5/12
[52] U.S. Cl. ..................................... 427/53.1; 427/89; 427/91; 427/92; 427/124; 427/125; 427/250; 427/252; 427/305
[58] Field of Search ................... 427/53.1, 89, 91, 92, 427/98, 99, 124, 125, 305, 306, 250, 252, 253

[56] References Cited

U.S. PATENT DOCUMENTS

| | | | |
|---|---|---|---|
| 4,259,409 | 3/1981 | Arnold | 427/125 X |
| 4,340,617 | 7/1982 | Deutsch et al. | 427/53.1 |
| 4,420,365 | 12/1983 | Lehren | 427/305 X |
| 4,472,513 | 9/1984 | Hammond et al. | 427/53.1 X |
| 4,486,463 | 12/1984 | Rubner et al. | 427/305 X |
| 4,495,255 | 1/1985 | Draper et al. | 427/125 X |

OTHER PUBLICATIONS

Karlicek, R. F. et al., *Laser-Induced Metal Deposition on InP*, J. Appl. Phys. 53(2), Feb. 1982.

*Primary Examiner*—Michael R. Lusignan
*Attorney, Agent, or Firm*—Joseph G. Walsh

[57] ABSTRACT

A process for selectively depositing copper by first selectively depositing palladium seeds by irradiating a palladium compound with light. Following the deposition of the palladium seeds, copper is deposited by an electroless process.

7 Claims, No Drawings

SELECTIVE DEPOSITION OF COPPER

DESCRIPTION

TECHNICAL FIELD

The present invention is concerned with a method for the selective deposition of copper, for example, in the manufacture of a circuit board.

BACKGROUND ART

It is well known in the art that palladium metal acts as a seeding material for electroless copper deposition. At present the seeding operation is carried out by a wet process which requires the use of several steps.

U.S. Pat. No. 4,340,617 shows one type of apparatus which may be used in the vapor phase step of the process of the present invention.

DISCLOSURE OF THE INVENTION

According to the present invention, copper is selectively deposited on a substrate by a process in which small palladium clusters or seeds are first selectively deposited on a substrate. Following the selective deposition of the palladium clusters copper is deposited by electroless plating in the seeded area.

The selective deposition of the palladium seeds is accomplished by contacting the substrate with the vapor of a palladium compound and selectively irradiating the complex with light, which can be a laser. The light can act in either of two methods, one, a photothermal method in which the substrate absorbs the radiation and, two, a photochemical method in which the complex absorbs the radiation. In both methods the palladium compound is reduced to palladium metal without the necessity to use a reducing atmosphere or co-reductant. A variety of substrates may be used including, for example, silicon, alumina, ceramic, quartz and polymers. The process is particularly applicable to forming patterned copper deposition on circuit boards.

In one particular preferred variation of the present invention, the substrate is first covered with photoresist or polymer. When the substrate which has been coated with the polymer is selectively irradiated, for example, through a mask, with a pulsed excimer laser, removal of the polymer occurs in the irradiated area. When the substrate is exposed to the vapors of the palladium-containing complex, deposition of a metal film occurs at the same place. The film than acts as a seed for plating of copper. In this way, the circuitry is imbedded in a polymeric film, the surfaces of which are level. The circuitry is thus protected from mechanical damage. The ablative etching and the deposition of the metal seed can take place either simultaneously or as separate steps in the same apparatus.

In the present invention the preferred palladium compound is palladium (II) bis(hexafluoroacetylacetonate) which is usually written as $Pd(hfac)_2$. Other derivatives of this compound may also be used. In general, the preferred palladium compounds are those in which the palladium is bonded to oxygen.

EXAMPLE

A silicon wafer coated with a 2.4 micron thick layer of cured polyimide was placed in a vacuum chamber equipped with a quartz window and a well to hold the metal complex out of the path of the light. The coated wafer was irradiated in the presence of vapor of palladium(II) bis-(hexafluoroacetylacetonate) in a patterned fashion with light from a pulsed excimer laser operating at 249 nm. After a thirty-second exposure at a power density of about 5 Mwatt/$cm^2$ and a repetition rate of 100 Hz, the polymer was completely removed from the silicon substrate in the areas of irradiation and a thin layer of grey palladium metal was visible on the surface. Subsequent plating in an electroless copper bath gave copper features which had a thickness almost that of the remaining polymer layer. Adhesion of the copper to the silicon (by adhesive tape test) was better than that of the polyimide.

We claim:

1. A process for the selective deposition of copper on a substrate, said process comprising the steps:
    (1) contacting the substrate with the vapor of a palladium compound;
    (2) selectively irradiating said palladium compound with light to cause selective deposition of seeds of palladium metal on said substrate; and
    (3) depositing copper by electroless deposition on those areas of the substrate which have been seeded with palladium.

2. A process as claimed in claim 1 wherein the palladium compound is palladium (II) bis-(hexafluoroacetylacetonate).

3. A process as claimed in claim 1 wherein the substrate is a semiconductor.

4. A process as claimed in claim 1 wherein the substrate is a polymer.

5. A process as claimed in claim 1 wherein the substrate is a ceramic.

6. A process as claimed in claim 1 wherein the light is a laser.

7. A process as claimed in claim 1 wherein the substrate is first covered with a polymer which is selectively removed by irradiation with an excimer laser and wherein the palladium seeds are deposited on the substrate in the areas where the polymer has been removed.

* * * * *